United States Patent [19]

Feldman et al.

[11] Patent Number: 4,654,470

[45] Date of Patent: Mar. 31, 1987

[54] RAINTIGHT JUNCTION BOX

[75] Inventors: Steven Feldman, Seminole, Fla.; Marvin H. Jones, Dillsburg, Pa.

[73] Assignee: Amp Incorporated, Harrisburg, Pa.

[21] Appl. No.: 811,052

[22] Filed: Dec. 19, 1985

Related U.S. Application Data

[63] Continuation-in-part of Ser. No. 546,792, Oct. 31, 1983, Pat. No. 4,623,753, and Ser. No. 642,012, Aug. 20, 1984, abandoned.

[51] Int. Cl.$^4$ ............................................. H05K 5/03
[52] U.S. Cl. ..................... 174/50; 174/65 R; 220/3.8
[58] Field of Search ............ 174/50, 52 R, 52 S; 220/3, 8, 228, 354

[56] References Cited

U.S. PATENT DOCUMENTS

| | | | |
|---|---|---|---|
| 1,359,351 | 11/1920 | Gash | 220/228 X |
| 1,404,113 | 1/1922 | Gonnella | 220/228 |
| 3,801,727 | 1/1974 | Wilkinson et al. | 174/50 |
| 3,873,757 | 3/1975 | Berke et al. | 174/52 R |

FOREIGN PATENT DOCUMENTS

101237 of 1916 United Kingdom ............ 174/65 R

Primary Examiner—Thomas J. Kozma
Assistant Examiner—D. A. Tone
Attorney, Agent, or Firm—Eric J. Groen

[57] ABSTRACT

A raintight electrical junction box is disclosed for use outdoors and includes a base member having a peripheral channel while the cover has a labyrinth profiled to be received in the channel, when the cover is placed over the base member. The mating geometry of the labyrinth and the channel provide a gasketless peripheral seal between the cover and base member.

24 Claims, 14 Drawing Figures

RAINTIGHT JUNCTION BOX

This application is a continuation-in-part of U.S. pat. applications Ser. No. 546,792 filed Oct. 31, 1983 U.S. Pat. No. 4,623,753, and Ser. No. 642,012 filed Aug. 20, 1984 abandoned.

BACKGROUND OF THE INVENTION

1. Field of the Invention

The present invention relates to a raintight junction box used for electrical connections.

Junction boxes for use outdoors, such as for photovoltaic solar panel installations, must be made raintight to prevent water from contacting electrical terminations inside. This is conventionally accomplished by a deformable seal such as a precut elastomer, closed cell foam, rubber O-rings, etc. As these are discrete items of manufacture and require assembly, they add to the cost of manufacture and installation. Furthermore, they are subject to misalignment, damage and deterioration. A junction box, which would be impervious to rain water, humidity and condensation without regard to installation orientation, and yet be without a discrete seal would not only be less expensive but also easier to assemble and more reliable.

2. Description of the Prior Art

U.S. Pat. No. 4,244,484 discloses a junction box similar in configuration to the present invention yet utilizes an elastomer seal such as an O-Ring.

U.S. Pat. No. 3,873,757 discloses a circuit protector similar in configuration to the present invention but requires a circular elastomeric gasket.

SUMMARY OF THE INVENTION

The preferred embodiment of this invention relates to a raintight gasketless junction box. The junction box base has a channel around the periphery for receiving a labyrinth on the junction box cover. The mating of the cover and the base produces dimensionally controlled capillaries, such capillaries acting as water seals.

The junction box has at least one entry for wires, such entry having an elastomeric seal for preventing moisture from entering the cavity. The preferred embodiment of the invention has a conductive terminal for electrically interconnecting one or more electrical wires to photovoltaic module bus bars. The invention is used for outdoor interconnection of solar modules, and the junction box may be oriented in any direction and act as a raintight box.

DESCRIPTION OF THE PREFERRED EMBODIMENT

Figure 1:
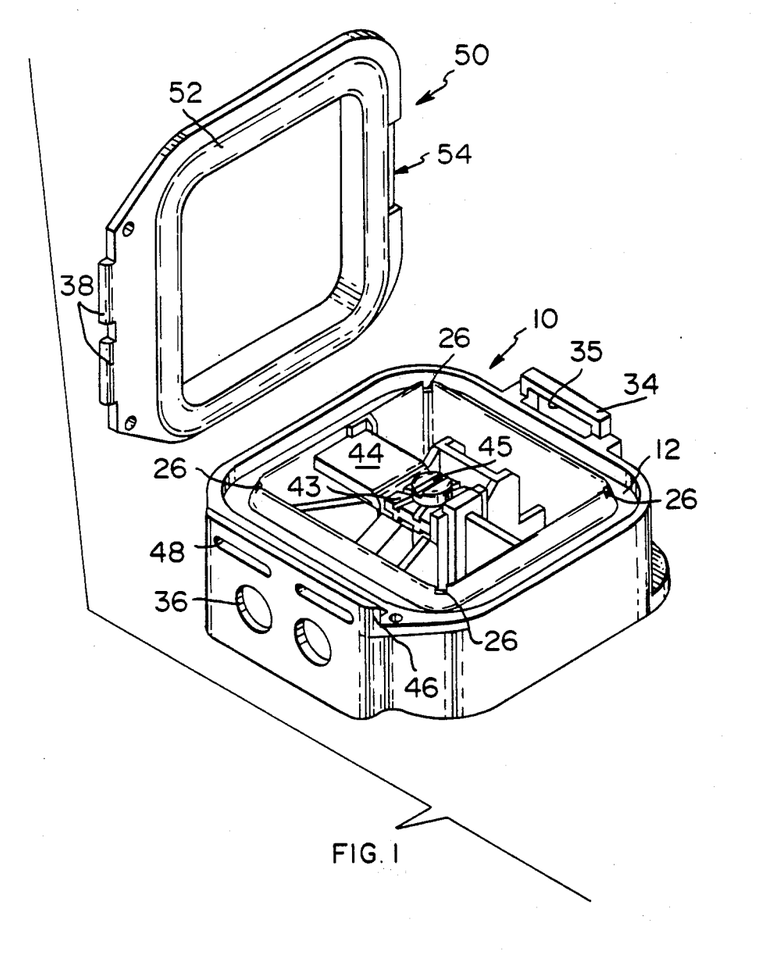
FIG. 1 is an exploded perspective of the subject terminal block.
Figure 2:
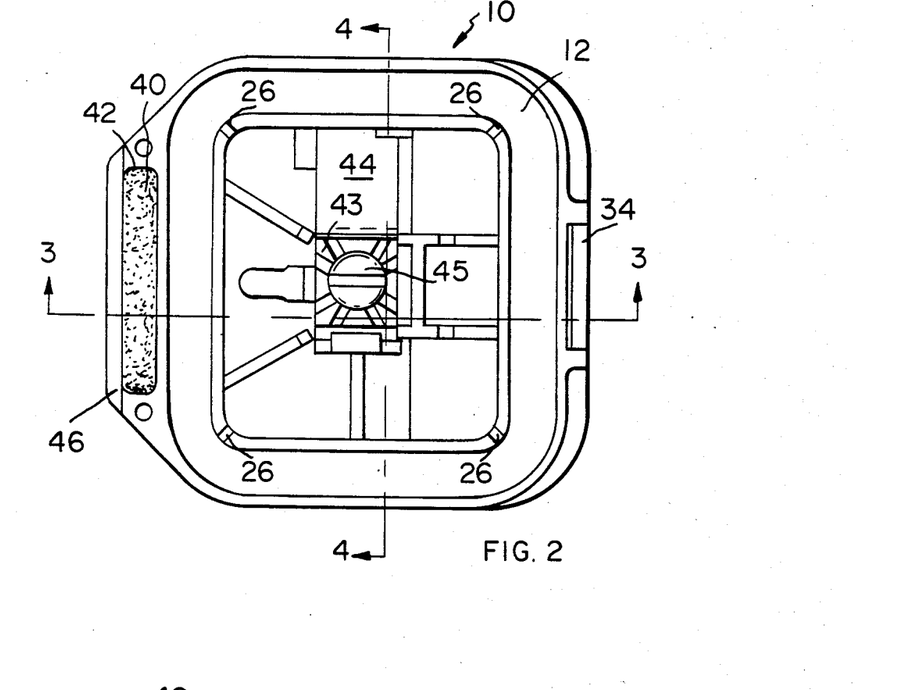
FIG. 2 is a top plan view of the subject terminal block.
Figure 3:
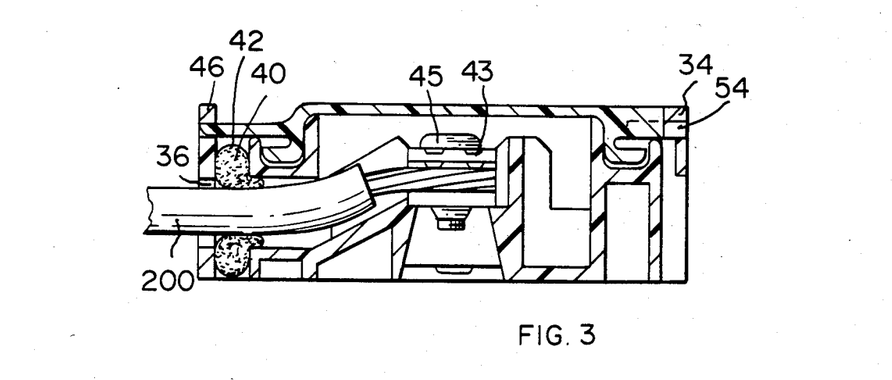
FIG. 3 is a section taken along line 3—3 of FIG. 2, with the cover in place.
Figure 4:
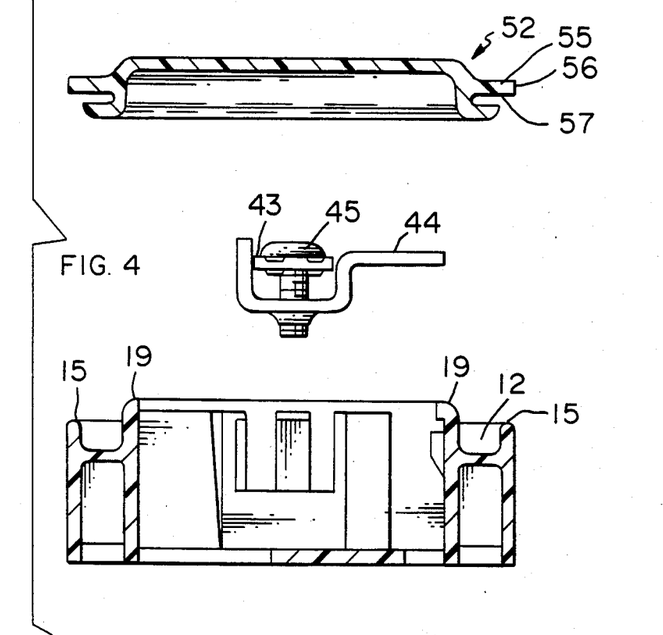
FIG. 4 is a section taken along line 4—4 of FIG. 2 without the cover in place.

The subject invention relates to a junction box for outdoor use, impervious to moisture due to rain, condensation and the like. As shown in FIG. 1, the junction box inludes a housing member 10 and a cover member 50 which encloses the housing member 10. Both cover 50 and housing 10 are formed of a polymer such as Noryl (Noryl is a trademark of the General Electric Co. and is a phenylene oxide). Housing member 10 includes a channel 12 running peripherally around the top of the housing, and also includes longitudinal apertures 48 in upstanding portion 46. Housing 10 further includes cover lock 34 upstanding from the base defining a slot 35. Housing member 10 further includes a terminal member 44 having a washer 43 and screw 45. As shown in FIGS. 2 and 3, the housing member 10 further includes apertures 36 for wire entry and grommet 40 disposed within a channel 42, for sealing around wires 200. Wires to be interconnected are placed through apertures 36, grommet 40 and interconnected by means of terminal 44, the conductors of wires 200 being forced between terminal 44 and washer 43 by means of screw 45.

As shown in FIG. 1, cover member 50 has a labyrinth member 52, which runs peripherally around the inside surface of the cover, and is profiled to be received in channel member 12 of housing 10. The cover member further includes latch ears 38 which are profiled to be received in longitudinal slots 48 on housing member 10. Cover member 50 also includes slidable cover latch 54, which is slidably received within slot 35.

After terminating one or more wires 200 to terminal 44, cover 50 is placed over the housing 10, and labyrinth means 52 of cover 50 is disposed within channel 12 of housing member 10 which provides sealing means as hereinafter disclosed. Cover 50 is locked in place by latches 38 in apertures 48, and by slidable lock 54 in place in lock 34.

Figure 5A:
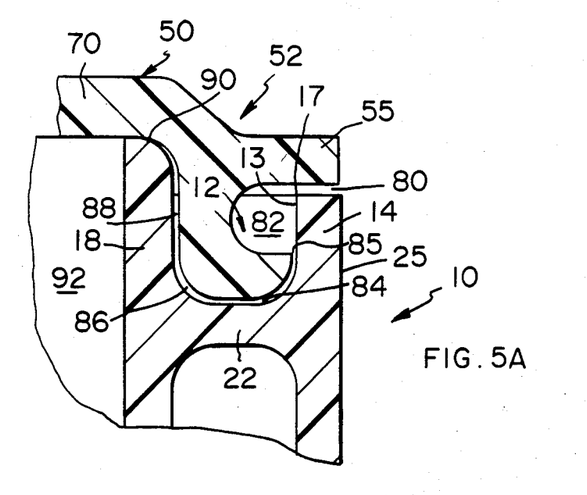
FIG. 5A shows the mating geometry of the cover and the base.
Figures 5B, 6, 7:
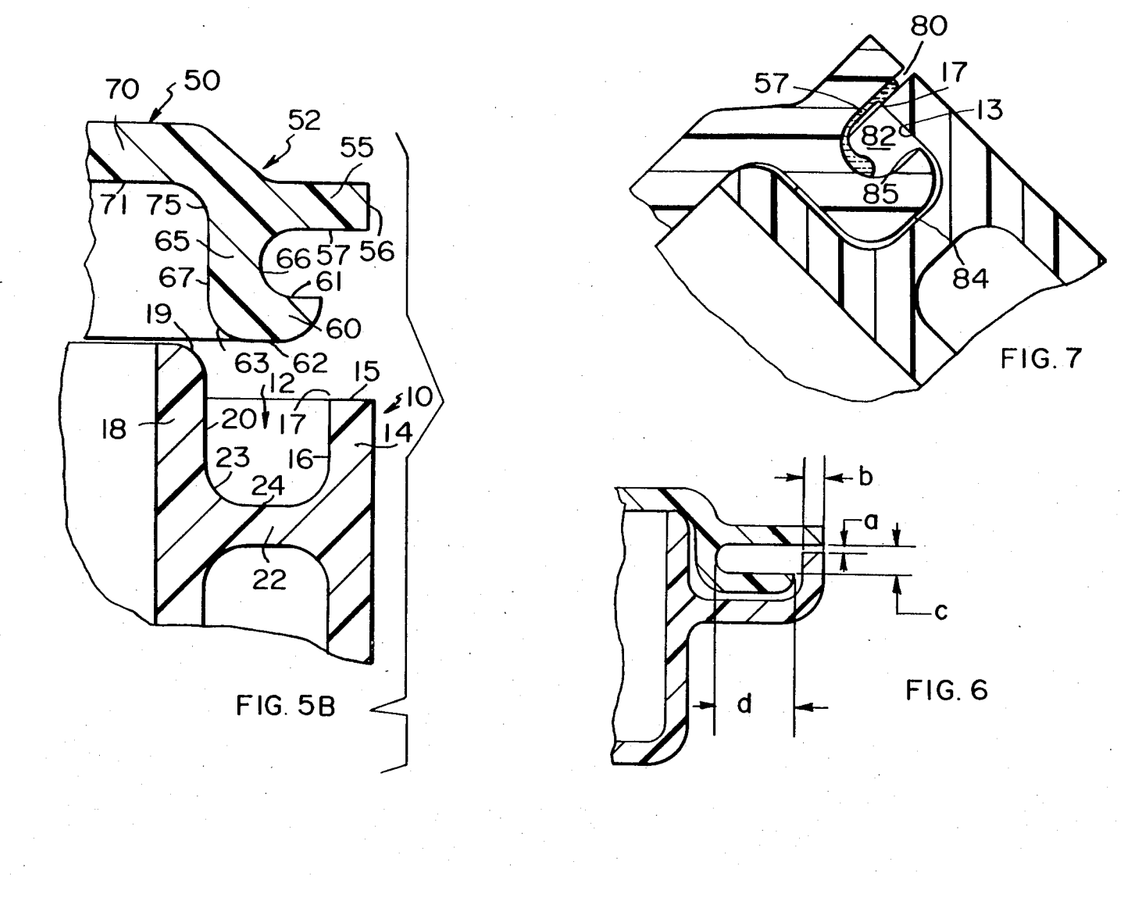
FIG. 5B is a view similar to that of FIG. 5A with the cover exploded from the base.
FIG. 6 is a view similar to that of FIG. 5A showing the critical dimensions.
FIG. 7 shows the junction box at an oblique angle.

Referring now to FIGS. 5A and 5B, the geometry of the labyrinth 52 and channel 12 will be discussed in greater detail. As shown in FIG. 5B, channel 12 is defined by exterior upstanding wall 14, interior upstanding wall 18, and floor 22. Exterior upstanding wall 14 hasd distal tip 15 and surface 16, interior upstanding wall 18 has distal tip 19 and surface 20, and floor 22 has surface 24. The intersection of surface 20 of wall 18 and surface 24 of floor 22 forms radius of curvature 23. As further shown in FIG. 5B, labyrinth 52 is comprised of upper flange 55, lower flange 60 and wall 65. Upper flange 55 has distal tip 56 and surface 57, lower flange 60 has surfaces 61 and 62, and wall 65 has surfaces 66 and 67. The intersection of surface 62 of flange 60 and surface 67 of wall 65 form radius of curvature 63. The cover 50 has a base section 70 having an inner surface 71. The intersection of surface 71 of base section 70 and surface 67 of wall 65 defines radius of curvature 75.

As shown in FIGS. 5A and 5B, when cover 50 is placed over housing 10, labyrinth 52 is contoured to be accepted within channel 12. The labyrinth 52 is not an interference fit within the channel 12, but rather, as contoured, clearance is completely maintained between the labyrinth 52 perimeters and the interior of channel 12. The only point of contact between the cover 50 and base 10 is at contact point 90. When cover 50 is lowered onto housing 10 as shown in FIG. 5A, the intersection of labyrinth 52 with channel 12 forms slit 80, duct 82, first capillary 84, expanded capillary 86, second capillary 88 and a point of contact 90. The combination of slit 80, duct 82, capillaries 84, 86, 88, and point of contact 90 create a raintight and gasketless peripheral seal, irrespective of the angle of terminal box orientation.

The slit 80 is a function of the stacking tolerances with respect to upstanding walls 18 and 14, mating with base 70 and flange 55 of cover 50. Slit 80 is formed by the parallel gap between surface 57 of flange 55 and the distal tip 15 of upstanding wall 14. Slit 80 must be dimensioned small enough to act as a deterrent to pulsating raindrops yet large enough to allow water which collects within the duct 82 to drain when the terminal box is offset from horizontal. The width "a" and depth "b" of slit 80, as labeled in FIG. 6, actually forms a capillary which exhibits sufficient hysteresis to reject pulsations of impacting rain. It has been found that adequate width and depth are 0.005 inches and 0.062 inches, respectively. It is important that slit 80 be formed by using corner 17 of upstanding wall 14, as shown in FIGS. 5A and 5B. First it provides for a uniform and parallel surface to that of surface 57. In order to provide for sufficient hysteresis, the capillary formed by slit 80 must be narrow yet deep. The corner 17 provides for a sufficient shoulder maintaining the parallel relationship between the two surfaces 57 and 15, for a maximum depth. Second, when the box is angled, as shown in FIG. 7, the corner 17 provides for a sharp edge which inhibits the droplets of water from flowing due to surface tension along surface 13 and into first capillary 84 by way of entrance 85. Rather than the water droplets forming a flowing sheet expending energy to overcome corner 17 to travel along surface 13 and run into entrance 85 of capillary 84, the water droplets are broken into a flowing film along surface 57 to disperse in duct 82, as shown in FIG. 7. Although slit 80 acts as a deterrent to the entry of rain into the duct 82, slit 80 cannot totally prevent the passage of water and therefore, alternate sealing means must be provided for.

As mentioned above, the intersection of the labyrinth 52 and channel 12 forms duct 82 which is in communication with slit 80. Although slit 80 allows for the entry of water, it is also a means for draining the water that has entered, via duct 82. When the assembled junction box is rotated, as shown in FIG. 8, the water will run peripherally around the duct 82, from the uppermost point through which water can seep from slit 80 to duct under influence of gravity to a point where a duct portion is bottom most, and will drain through the slit 80 at the point where the duct is bottom most.

In order that the water flows peripherally around the duct to drain, the height of the duct as shown in FIG. 6, is a critical dimension. The height "c" has to be great enough so that a single water droplet cannot bridge the gap between surface 61 of flange 60 and surface 57 of flange 55, as shown in FIG. 8. If the droplet were to bridge, the surface tension of the water droplet between surfaces 57 and 61 would hold the droplet in place, and prevent the droplet from flowing out of the duct lower portion. An adequate height "c" of the duct has been found to be 0.089 inches.

Figure 8:
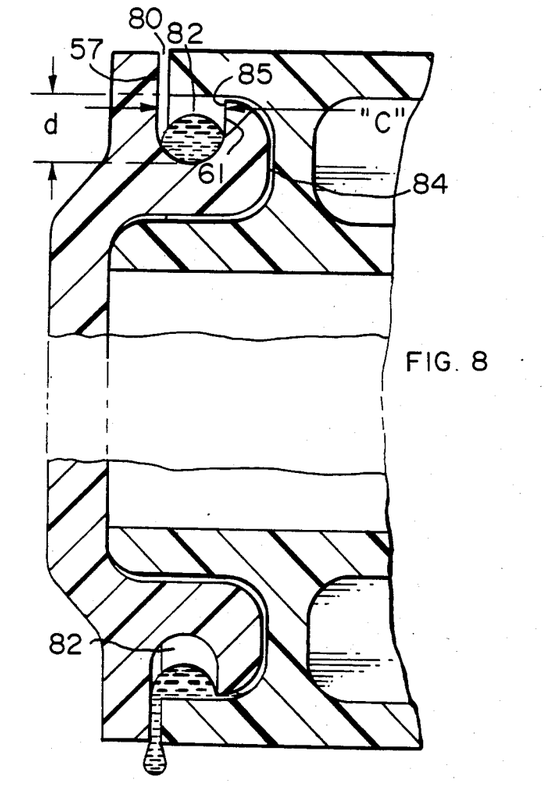
FIG. 8 shows the junction box positioned 90° from horizontal.

The length of duct 80, as shown in FIG. 6 as "d", must also be long enough such that when the junction box is 90° from horizontal, the height of a water droplet does not rise to meet the entrance 85 to first capillary 84, feeding first capillary 84 as shown in FIG. 8. An adequate dimension for length "d" has been found to be 0.193 inches.

Figures 10, 11:
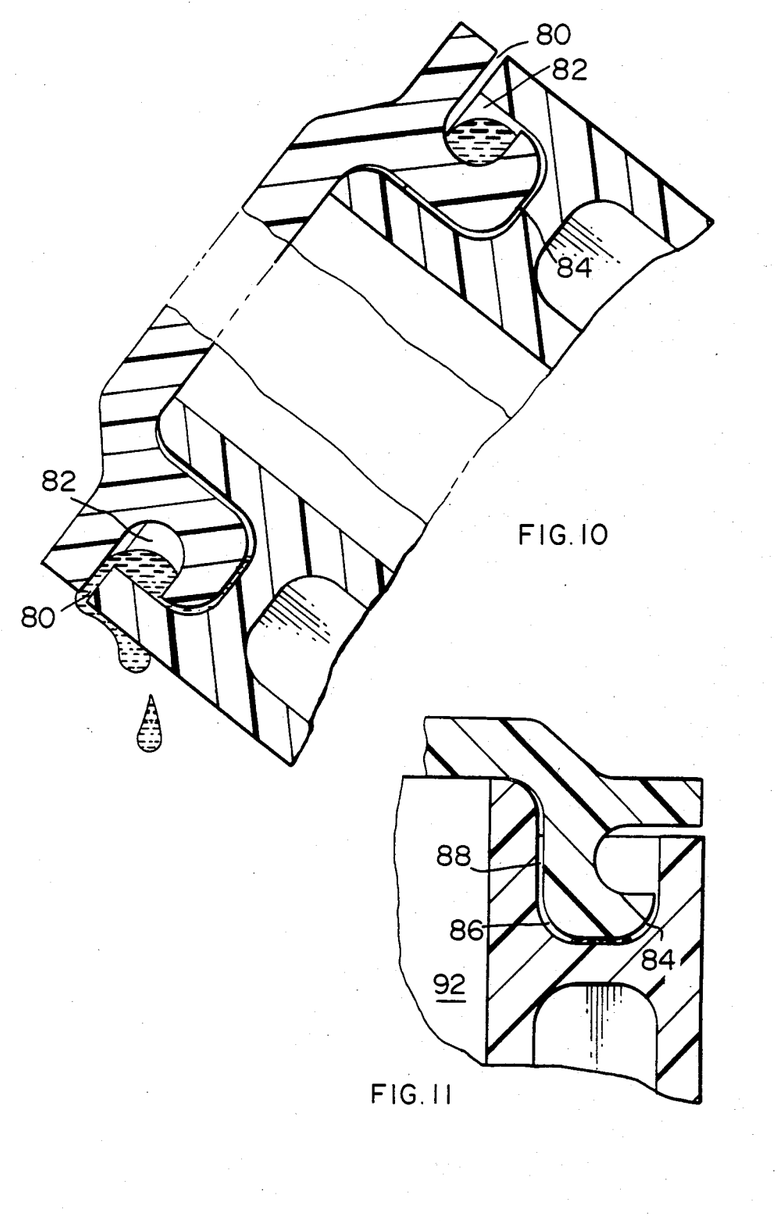
FIG. 10 shows the box angled and the draining of water out through the duct.
FIG. 11 shows water droplets in the first capillary.

Furthermore, duct length "d" has to be adequate to allow standing water in duct 82 to drain when the box is tilted as shown in FIG. 10. During a hard rain the water will accumulate in duct 82 but will flow peripherally around the duct to the lower end and drain via slit 80. The length "d" of 0.193 inches is also high enough to preclude water rising to a level where the water will meet entrance 85, feeding first capillary 84.

Capillaries 84, 86 and 88 are formed by adjoining surfaces of labyrinth 52 and channel 12, as shown in FIG. 5A, and work in conjunction with one another to prevent the drawing of water into the enclosure 92. If a few droplets of water happen to feed into capillary 84, as shown in FIG. 11, the water will be precluded from entering the second capillary 88 because of the expanded capillary 86 behind the first capillary 84. Expanded capillary 86 is a result of the adjacent radii of curvatures 63 and 23, as shown in FIG. 5B, the larger radius of curvature 63 forming a larger and expanded gap than between surfaces 62 and 24. As capillary attraction is always in the direction of the decreasing capillary area, the expanded capillary 86 prevents flow of water into the second capillary 88 from the first capillary 84, as shown in FIG. 11.

Figure 12A:
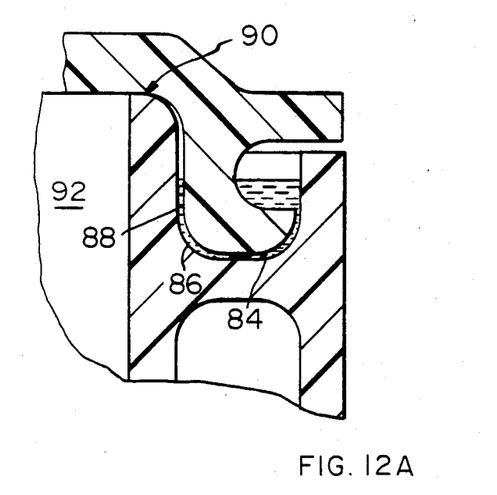
FIG. 12A shows the box upright with water in the duct seeking its own level into the second capillary.
Figure 12B:
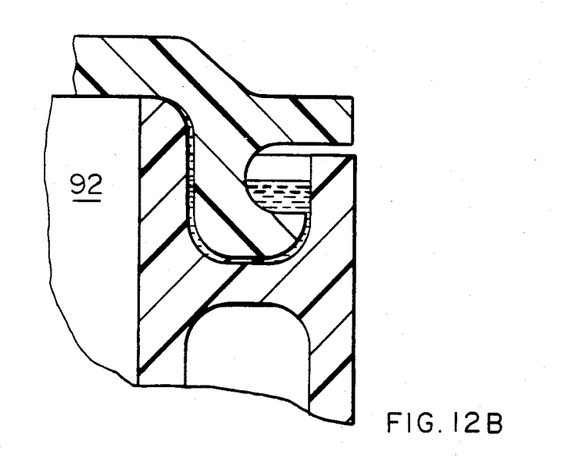
FIG. 12B is a view similar to that of FIG. 12A, but showing the water rising up into the second capillary due to capillary rise.

In the upright horizontal position, if there are more than a few droplets of water in duct 82, then the water level will, of course, seek its own level and the water will fill first capillary 84, expanded capillary 86 and partially fill second capillary 88, as shown in FIG. 12A. Because capillary 88 is upwardly decreasing in area, water will rise in capillary 88, as shown in FIG. 12B, but will be precluded from entering enclosure 92, since cavity 92 behaves as an expanded capillary (capillary break) beyond contact 90; the water cannot flow into the enclosure 92. The ending capillary past the point of contact 90 between surfaces 19 and 75 precludes the water from entering enclosure 92. Additionally, the surface tension of the water at point 90 will be so great due to extreme closeness of capillary walls that the water will appear to be very viscous. This apparent increase in viscosity will further prevent any water from entering the enclosure 92.

Figure 9:
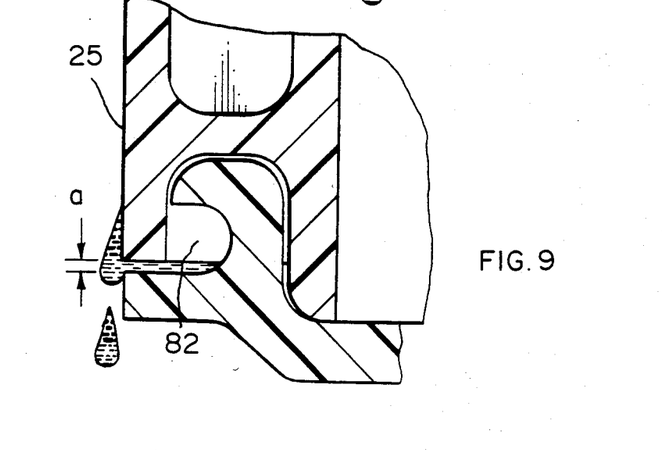
FIG. 9 shows a drop of water within the duct, the junction box being totally inverted.

If the junction box is totally inverted as shown in FIG. 9, any water accumulation within duct 82 will only reach a height equal to that of the slit width "a." Any raindrops running down exterior wall 25 past slit 80 will cause water to be drawn into duct 82 duct to capillary attraction. However the hydrostatic head on the water in duct 82 will force the water to drain and to seek its own level.

As best shown in FIG. 1, a notch 26 is located in each corner of inner upstanding wall 18. Should a water film be present around the entire periphery, between surfaces 19 and 75, notches 26 will break up that film. Communication of the air in enclosure 92 with the atmospheric air will prevent drawing of water into the enclosure, due to changes in atmospheric temperature and/or pressure.

Thus the present invention relates to an outdoor junction box which has a gasketless seal between the cover and housing which remains raintight at any orientation of the junction box.

The foregoing is exemplary and not intended to limit the scope of the claims.

What is claimed is:

1. A raintight enclosure comprising:
   a housing means including a cavity and an annular channel extending peripherally around said housing means,
   a cover means for placing over said housing means being cooperatively profiled with said channel to create a gap between an underside of the cover and an upper extremity of an outer wall which forms the channel, said cover means including a labyrinth means extending from the underside of said cover means profiled to be received in said channel means, the labyrinth means and the annular channel cooperatively comprising means for creating a peripheral raintight enclosure when the cover means is placed over the housing means; and
   means to allow presure equalization between the cavity interior and an ambient pressure preventing condensation in the cavity during changes in ambient conditions.

2. The enclosure of claim 1 wherein the annular channel is formed by inner and outer upstanding walls, said walls being interconnected by an annular floor.

3. The enclosure of claim 2 wherein the inner wall is higher upstanding than said outer wall.

4. The enclosure of claim 1 wherein the labyrinth means comprises a flange having a first section extending downwardly from said cover means in transition with a second section, said second section being in a parallel spaced relationship with said cover means.

5. A junction box comprising:
   a housing means having a lower surface and a first upstanding wall defining an inner cavity therein, a second upstanding wall concentrically arranged outside of said first upstanding wall, an annular floor beween and connecting the first and second walls forming a channel therebetween, the first wall being higher upstanding than said second wall, each said wall having a distal tip;
   a cover means having a central surface, a first flange means extending from the periphery of said central surface, an annular ring extending from said central surface, a second flange means attached to said annular ring extending below and parallel to said first flange means, the cover means being profile to fit over said housing means with the annular ring and second flange means extending into the channel such that the only contacting point between the cover and housing means is at the distal tip of said first upstanding wall, the annular ring, second flange means and channel comprising means for creating a peripheral raintight enclosure when the cover means is placed over the housing means,
   entry means for placing at least one wire into said inner cavity to be terminated therein to a conductor entering through the base of the enclosure.

6. The junction box of claim 5 wherein the profiles of the second flange means and the channel means cooperatively form an interior annular duct.

7. The junction box of claim 6 wherein a slit is formed between the distal tip of said second upstanding wall and said flange means, said slit being in communication with said duct.

8. The junction box of claim 5 wherein the adjacent surfaces of the second flange means and the annular floor of the channel create a first capillary therebetween.

9. The junction box of claim 8 wherein the adjacent surfaces of the annular ring of said cover means and the first upstanding wall create a second capillary therebetween.

10. The junction box of claim 9 further comprising an expanded capillary between the first and second capillaries.

11. The junction box as claimed in claim 5, wherein the entry means comprises apertures extending through said housing means.

12. The junction box of claim 11 wherein a sealing means is disposed adjacent to said apertures comprising means for sealing wires placed through the apertures.

13. The junction box of claim 12 wherein the sealing means is a foam member for piercing the wire therethrough.

14. The junction box of claim 5 comprising a terminal means therein for terminating one or more wires.

15. A raintight enclosure comprising:
    a housing means having a cavity therein and a channel extending peripherally around said enclosure, said channel being defined by inner and outer upstanding walls and a floor therebetween;
    a cover means having a labyrinth means extending from the cover means, the cooperation between the channel and the labyrinth means forming a first capillary, a second capillary, and an expanded capillary disposed between said first and second capillaries, the expanded capillary profiled to act as a capillary break between the first and second capillaries to prevent water droplets entering the first capillary from capillary attraction into the second capillary and into the cavity, said cover means being spaced from a distal tip of said outer upstanding wall.

16. The enclosure of claim 15 wherein the profiles of the labyrinth means and the channel cooperatively form an interior annular duct.

17. The enclosure of claim 16 wherein the channel is defined by second upstanding walls disposed outside of said first walls, with a floor interconnecting the first and second walls.

18. The enclosure of claim 17 wherein the cover means includes a first flange means overlying said channel, the distal tip of said outer upstanding wall and an underside surface of said first flange means profiled as substantially parallel surfaces defining a capillary therebetween having, sufficient hysteresis to inhibit the direct influx of impending rain.

19. The enclosure of claim 18 wherein the labyrinth comprises an annular ring extending downwardly from an underside of said base continuous with a second flange means profiled to lie adjacent to the floor of said channel.

20. The enclosure of claim 19 wherein the first and second flange means are substantially parallel to one another with adjacent surfaces being spaced apart a sufficient distance to prevent a water droplet from bridging the gap between the two surfaces.

21. The enclosure of claim 17 further comprising a communication between the cavity interior and the duct to equalize the pressure between the cavity interior and an ambient pressure.

22. The enclosure of claim 21 wherein the communication comprises notches in the distal tip of the inner upstanding wall.

23. The enclosure of claim 15 wherein the cover means and distal tip of the inner upstanding wall are substantially in contact with one another causing the surface tension of the water at the point of contact to act as an extremely viscous fluid preventing water in the second capillary from capillary attraction into the cavity.

24. The enclosure of claim 15 further comprising means to allow pressure equalization between the cavity interior and an ambient pressure.

* * * * *